(12) United States Patent
Jeong et al.

(10) Patent No.: US 8,546,164 B2
(45) Date of Patent: Oct. 1, 2013

(54) METHOD OF MANUFACTURING DISPLAY DEVICE INCLUDING THIN FILM TRANSISTOR

(75) Inventors: Hong-Han Jeong, Yongin (KR); Jae-Kyeong Jeong, Yongin (KR); Yeon-Gon Mo, Yongin (KR); Hui-Won Yang, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/293,158

(22) Filed: Nov. 10, 2011

(65) Prior Publication Data
US 2012/0052609 A1 Mar. 1, 2012

Related U.S. Application Data

(62) Division of application No. 12/385,197, filed on Apr. 1, 2009, now Pat. No. 8,058,645.

(30) Foreign Application Priority Data

Apr. 3, 2008 (KR) .................. 10-2008-0031090

(51) Int. Cl.
*H01L 21/36* (2006.01)

(52) U.S. Cl.
USPC .............. 438/45; 257/E33.014; 257/E21.411

(58) Field of Classification Search
USPC ........................................... 438/45
See application file for complete search history.

(56) References Cited

U.S. PATENT DOCUMENTS

| 7,211,825 B2 | 5/2007 | Shih et al |
| 2007/0138941 A1 | 6/2007 | Jin et al. |
| 2007/0139606 A1 | 6/2007 | Kim et al. |
| 2007/0252147 A1 | 11/2007 | Kim et al. |
| 2008/0237598 A1 | 10/2008 | Nakayama |

FOREIGN PATENT DOCUMENTS

| JP | 2004-273614 A | 9/2004 |
| JP | 2007-250982 A | 9/2007 |
| JP | 2008-072012 A | 3/2008 |
| KR | 10-2007-0035373 A | 3/2007 |
| KR | 10-0732849 B1 | 6/2007 |
| KR | 10-2007-0102939 A | 10/2007 |
| WO | WO 2007/108293 A1 | 9/2007 |

OTHER PUBLICATIONS

Suresh, et al., "High performance transparent thin film transistors based on indium gallium zinc oxide as the channel material." 2007 IEEE, pp. 587-590.

*Primary Examiner* — Wensing Kuo
(74) *Attorney, Agent, or Firm* — Lee & Morse, P.C.

(57) ABSTRACT

A thin film transistor (TFT), including a substrate, a gate electrode on the substrate, an oxide semiconductor layer including a channel region, a source region, and a drain region, a gate insulating layer between the gate electrode and the oxide semiconductor layer, and source and drain electrodes in contact with the source and drain regions of the oxide semiconductor layer, respectively, wherein the oxide semiconductor layer has a GaInZnO (GIZO) bilayer structure including a lower layer and an upper layer, and the upper layer has a different indium (In) concentration than the lower layer.

6 Claims, 8 Drawing Sheets

METHOD OF MANUFACTURING DISPLAY DEVICE INCLUDING THIN FILM TRANSISTOR

CROSS REFERENCE TO RELATED APPLICATION

This is a divisional application based on application Ser. No. 12/385,197, filed Apr. 1, 2009 now U.S. Pat. No. 8,058,645, the entire contents of which is hereby incorporated by reference.

BACKGROUND

1. Field of the Invention

Embodiments relate to a thin film transistor, a display device including the same, and associated methods.

2. Description of the Related Art

A thin film transistor (TFT) may include an active layer with a channel region, a source region and a drain region, and a gate electrode on the channel region. The gate electrode may be electrically isolated from the active layer by a gate insulating layer. The active layer of the TFT described above may generally include a semiconductor material, e.g., amorphous silicon or polysilicon. However, if the active layer is formed of amorphous silicon, mobility may be low, so that it may be difficult to operate a driving circuit at high speed. On the other hand, if the active layer is formed of polysilicon, mobility may be high, and a threshold voltage may be non-uniform. Therefore, a separate compensating circuit may be necessary.

In a conventional method of fabricating a TFT using low temperature polysilicon (LTPS), a high-cost process, e.g., a laser heating treatment, may be used. In addition, it may not be easy to control characteristics. Therefore, it may be difficult to apply the conventional method of fabricating a TFT using LTPS to a large-area substrate.

In order to solve these problems, an oxide semiconductor as an active layer has been considered. An oxide semiconductor using zinc oxide (ZnO) as a main element is thought to be an amorphous and stable material. If such an oxide semiconductor is used as an active layer, a TFT may be fabricated using a conventional LTPS process, and the LTPS process may be performed at a low temperature, e.g., about 300° C. or less. However, in order to use an oxide semiconductor in a TFT device, a process that satisfies and improves electrical characteristics may be required.

SUMMARY

Embodiments are therefore directed to a thin film transistor, a display device including the same, and associated methods, which substantially overcome one or more of the problems due to the limitations and disadvantages of the related art.

It is therefore a feature of an embodiment to provide a thin film transistor having an oxide semiconductor layer with improved electrical characteristics.

It is therefore another feature of an embodiment to provide a method of preparing a thin film transistor having an oxide semiconductor layer with minimized plasma damage.

At least one of the above and other features and advantages may be realized by providing a thin film transistor (TFT), including a substrate, a gate electrode on the substrate, an oxide semiconductor layer including a channel region, a source region, and a drain region, a gate insulating layer between the gate electrode and the oxide semiconductor layer, and source and drain electrodes in contact with the source and drain regions of the oxide semiconductor layer, respectively, wherein the oxide semiconductor layer has a GaInZnO (GIZO) bilayer structure including a lower layer and an upper layer, and the upper layer has a different indium (In) concentration than the lower layer.

The In concentration of the lower layer may be higher than the In concentration of the upper layer.

The In concentration of the lower layer may be about 40 to about 60 at. %, and the In concentration of the upper layer may be about 30 to about 50 at. %.

At least one of the above and other features and advantages may also be realized by providing a display device, including a first substrate including a thin film transistor, and a second substrate opposite to the first substrate; wherein the thin film transistor includes a gate electrode on the first substrate, an oxide semiconductor layer including a channel region, a source region and a drain region, a gate insulating layer between the gate electrode and the oxide semiconductor layer, and source and drain electrodes in contact with the source and drain regions, respectively, and the oxide semiconductor layer includes a GIZO bilayer structure including a lower layer and an upper layer, and the upper layer has a different indium (In) concentration than the lower layer.

The first substrate may include a plurality of pixels defined by a plurality of first and second conductive lines, the thin film transistor controlling a signal supplied to each of the pixels, and a first electrode coupled to the thin film transistor, the second substrate includes a second electrode, and the display device further includes a liquid crystal layer in a sealed space between the first and second electrodes.

The first substrate may include an organic light emitting device having a first electrode, an organic thin film layer, a second electrode, and the thin film transistor controlling operations of the organic thin film layer.

The In concentration of the lower layer may be higher than the In concentration of the upper layer.

The In concentration of the lower layer may be about 40 to about 60 at. %, and the In concentration of the upper layer may be about 30 to about 50 at. %.

At least one of the above and other features and advantages may also be realized by providing a method of manufacturing a display device, including forming a thin film transistor, including forming a gate electrode on a substrate, forming a gate insulating layer on the substrate having the gate electrode, forming on the gate insulating layer an oxide semiconductor layer with a channel region, a source region and a drain region, forming source and drain electrodes in contact with the source and drain regions of the oxide semiconductor layer, respectively, wherein the forming of the oxide semiconductor layer includes depositing ions including In, Ga, and Zn from a target to form a lower layer on the gate insulating layer, and forming an upper layer on the lower layer, the upper layer having an In concentration lower than the lower layer, and providing a display panel with the thin film transistor.

The In concentration of the lower layer may be about 40 to about 60 at. %, and the In concentration of the upper layer may be about 30 to about 50 at. %.

The target may include an InGaZnO target and an InZnO target.

During forming the lower layer and upper layer, the In concentration in the upper layer may be altered by adjusting the amplitude of the bias power applied to the respective InGaZnO and InZnO targets.

During forming the lower layer and upper layer, the In concentration in the upper layer may be altered by adjusting the intensity of a pulse laser irradiating the respective InGaZnO and InZnO targets.

During forming the lower layer and upper layer, the In concentration is altered by adjusting the molar ratio of In in the InGaZnO and InZnO targets.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION

Figure 1:
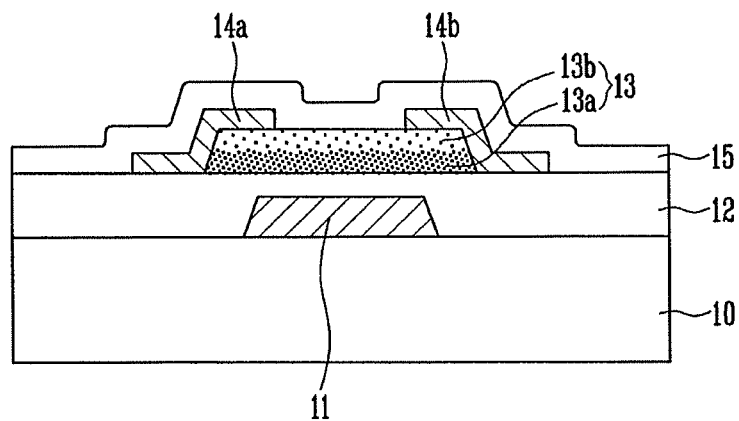
FIG. 1 illustrates a cross-sectional view of a TFT according to an embodiment.

Korean Patent Application No. 10-2008-0031090, filed on Apr. 3, 2008, in the Korean Intellectual Property Office, and entitled: "Thin Film Transistor, Method of Manufacturing the Thin Same and Flat Panel Display Device Having the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "a metal" may represent a single compound, e.g., molybdenum, or multiple compounds in combination, e.g., molybdenum mixed with tungsten.

In the following detailed description, only certain exemplary embodiments have been shown and described, simply by way of illustration. As those skilled in the art would realize, the described embodiments may be modified in various different ways, all without departing from the spirit or scope. Accordingly, the drawings and description are to be regarded as illustrative in nature and not restrictive. Also, when an element is referred to as being "connected to" another element, it can be directly connected to the element or be indirectly connected to the element with one or more intervening elements interposed therebetween. Hereinafter, like reference numerals refer to like elements.

FIG. 1 illustrates a cross-sectional view of a TFT according to an embodiment. A gate electrode 11 may be formed on a substrate 10 made of, e.g., an insulating material. A buffer layer (not shown) made of, e.g., a silicon oxide layer ($SiO_2$), a silicon nitride layer ($SiN_x$), etc., may be formed between the substrate 10, and the gate electrode 11.

A gate insulating layer 12 may be formed on the substrate 10 having the gate electrode 11. An oxide semiconductor layer 13 may be formed on the gate insulating layer 12. The oxide semiconductor layer 13 may be electrically isolated from the gate electrode 11. The oxide semiconductor layer 13 may include a channel region, a source region, and a drain region. The oxide semiconductor layer 13 may include a GaInZnO (GIZO) bilayer structure including a lower layer 13a and an upper layer 13b. The upper layer 13b may have a different indium (In) concentration than the lower layer 13a. In the GIZO bilayer structure, the In concentration of the lower layer 13a may be higher than the In concentration of the upper layer 13b.

Source and drain electrodes 14a and 14b may be formed on the oxide semiconductor layer 13. The source and drain electrodes 14a and 14b may contact the source and drain regions of the oxide semiconductor layer 13, respectively. A passivation layer 15 may be formed on the substrate 10 having the source and drain electrodes 14a and 14b.

Figure 2A:
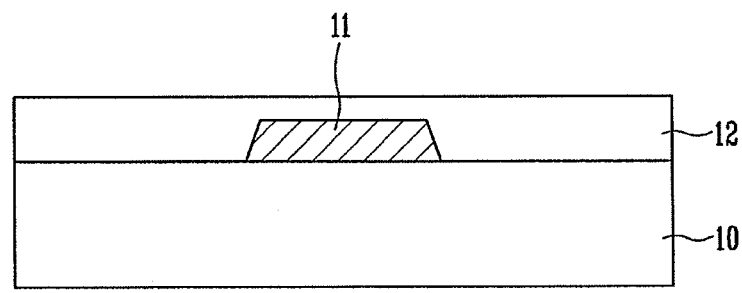
FIGS. 2A to 2C illustrate cross-sectional views of a method of manufacturing the TFT according to an embodiment.

Referring to FIG. 2A, a gate electrode 11 may be formed on a substrate 10 made of, e.g., an insulating material. A gate insulating layer 12 may then be formed on the substrate 10 having the gate electrode 11. A buffer layer (not shown) may be formed on the substrate 10. The gate electrode 11 may be formed on the buffer layer. The gate electrode 11 may include a metal, e.g., Mo, MoW, or Al. The gate insulating layer 12 may include, e.g., silicon oxide ($SiO_2$) or silicon nitride ($SiN_x$).

Figure 2B:
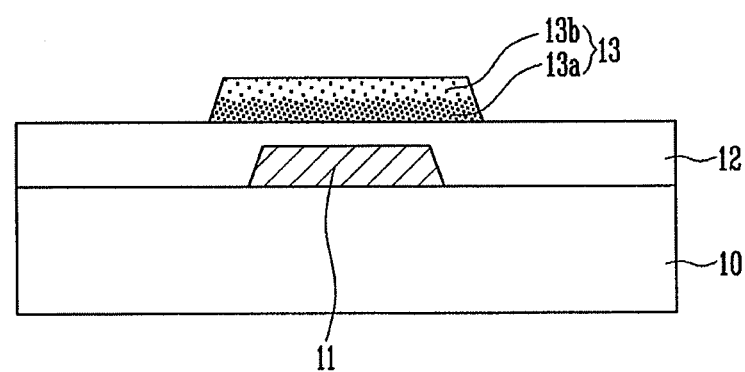

Referring to FIG. 2B, an oxide semiconductor layer 13 having a channel region, a source region, and a drain region may be formed on the gate insulating layer 12, and overlapping the gate electrode 11. The oxide semiconductor layer 13 may include a GIZO bilayer structure having different In concentrations in the upper and lower layers 13a and 13b. In the GIZO bilayer structure, the In concentration of the lower layer 13a may be higher than the In concentration of the upper layer 13b.

In an embodiment, to form a GIZO bilayer structure having different In concentrations, ions including In, Ga, and Zn may be deposited from a target so that a GIZO lower layer 13a is formed on the gate insulating layer 12. An upper layer 13b, with an In concentration lower than the lower layer 13a, may be formed on the lower layer 13a.

A GaInZnO (GIZO) target and an InZnO (IZO) target may be used as the targets. The GIZO layer may be deposited by, e.g., sputtering, pulsed laser deposition, etc. The In concentration may be controlled by adjusting, e.g., bias power applied to the targets, the laser pulse applied to the targets, or the molar ratio of the targets. That is, the In concentration of the lower layer 13a may be higher than that of a conventional GIZO layer. The In concentration of the upper layer 13b may be lower than that of the lower layer 13a.

For example, in a co-sputtering method, bias power may be applied to respective GIZO and IZO targets. The amplitude of the bias power applied to the targets may be adjusted in order to adjust the In concentration in the deposited layers.

In a pulse laser deposition method, a pulse laser may be irradiated on respective GIZO and IZO targets. The In concentration may be adjusted by adjusting the intensity of the pulse laser irradiating the GIZO and IZO targets.

In a generic deposition method, the In concentration may be adjusted by controlling the molar ratio of the elements in the GIZO and IZO targets. The desired In concentration may be achieved by selection of targets with a corresponding molar ratio of desired elements.

As an example, the In concentration of the GIZO lower layer 13a may be about 40 to about 60 at. %, and the In concentration of the GIZO upper layer 13b may be about 30 to about 50 at. %. Maintaining the In concentration of the GIZO lower layer 13a at about 40 at. % to about 60 at. % may help ensure semiconducting characteristics in the TFT. The In concentration of the GIZO lower layer 13a may be adjusted within the above range to obtain desired electrical characteristics.

Figure 2C:
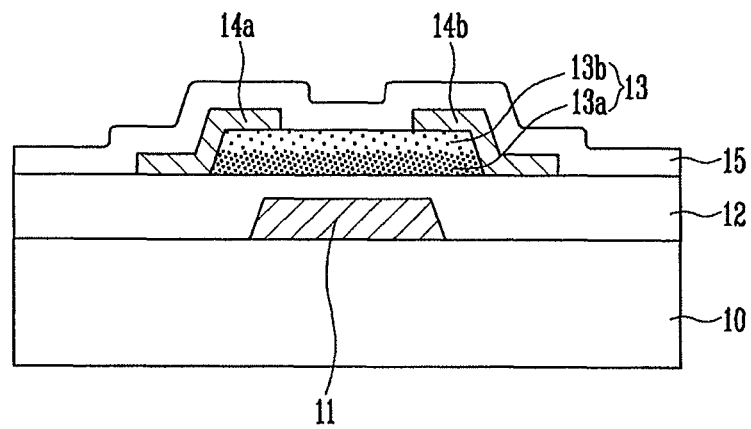

Referring to FIG. 2C, an upper conductive layer may be formed on the substrate 10 including the oxide semiconductor layer 13. The upper conductive layer may then patterned, forming source and drain electrodes 14a and 14b in contact with the source and drain regions, respectively. A passivation layer 15 may be formed on the substrate 10 including the source and drain electrodes 14a and 14b. As described above, a GIZO bilayer structure having different In concentrations may be used in the TFT of an embodiment.

In an oxide semiconductor, e.g., GIZO, indium (In) is an element having a conductive band. If an amount of In is increased, mobility of carriers (electrons) may be increased. On the basis of this principle, in the process of forming the oxide semiconductor layer 13, the In concentration of the lower layer 13a may be higher than that of a conventional GIZO layer. The In concentration of the upper layer 13b (e.g., 30 to 50 at. %) may be lower than that of the lower layer 13a (e.g., 40 to 60 at. %). The In concentration of the lower layer 13a may be higher than that of the conventional GIZO layer, so that mobility of carriers may be desirably increased. As a trap at the interface between the lower layer 13a and the gate insulating layer 12 is decreased, an s-factor may be improved.

Figure 3A:
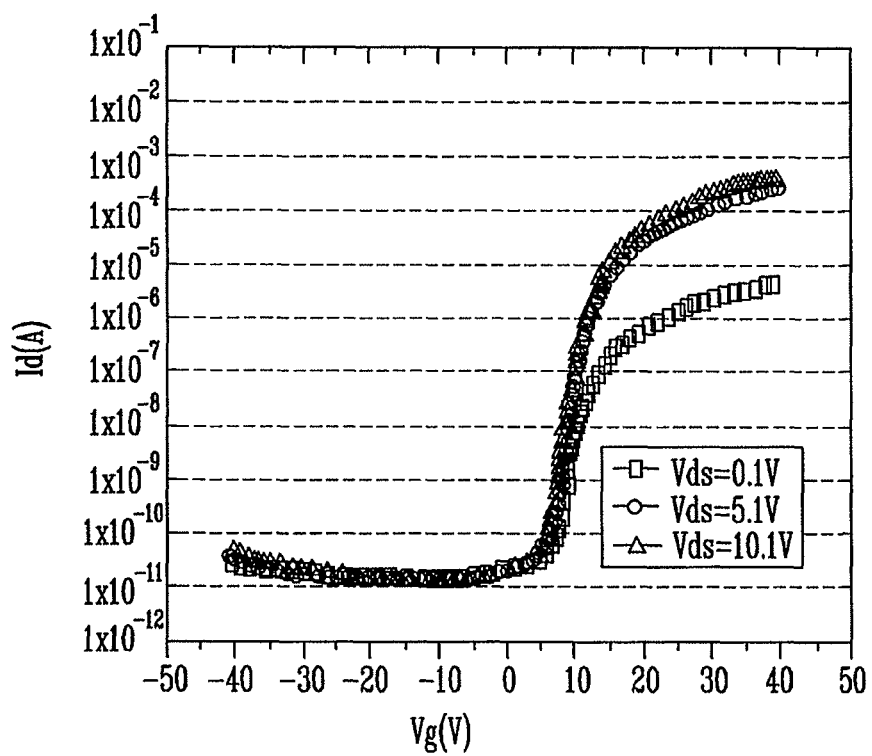
FIGS. 3A to 3C illustrate graphs of electrical characteristics of the TFT according to an embodiment.
Figure 3B:
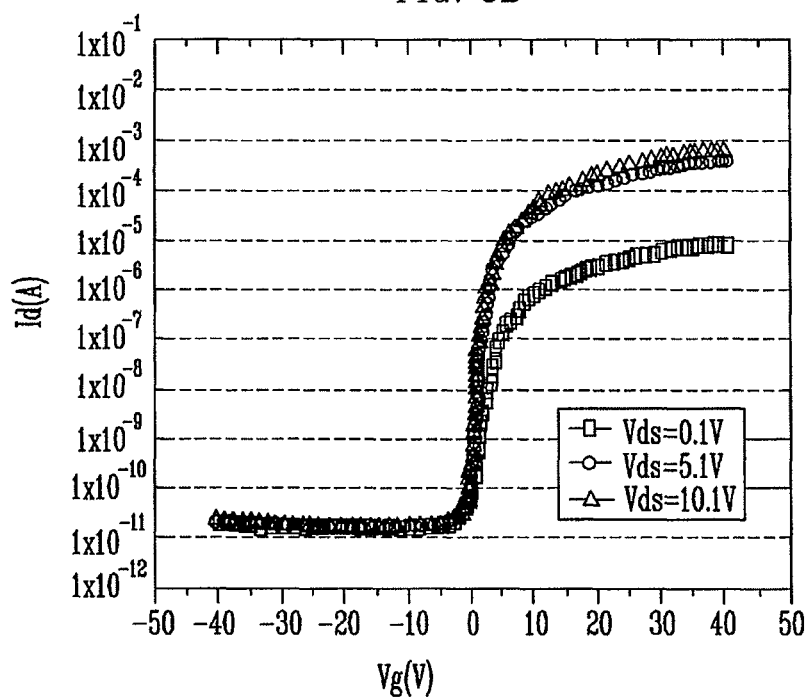
Figure 3C:
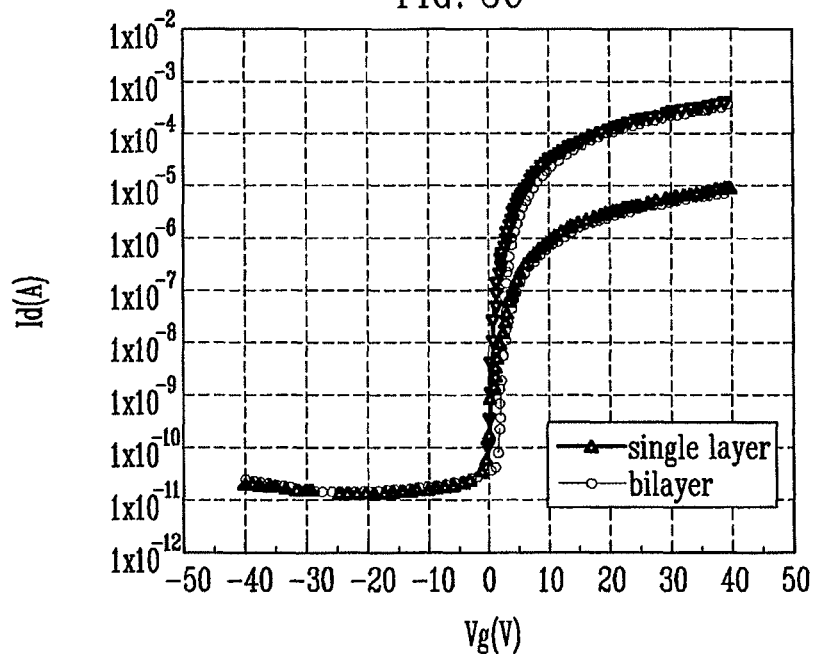

FIG. 3A illustrates a graph showing electrical characteristics of a TFT having an active layer made of GIZO. FIG. 3B illustrates a graph showing electrical characteristics of a TFT having an active layer formed with a GIZO active layer with an In concentration higher than that of the TFT of FIG. 3A (the conventional GIZO layer). An s-factor may be improved through a drain current $I_d$ in accordance with a gate voltage $V_g$, as compared with the conventional GIZO active layer. FIG. 3C illustrates a graph showing s-factors. One curve was measured when an active layer was formed with only the lower layer 13a, with an In concentration higher than that of the conventional GIZO layer (a single layer). The second curve was measured when an active layer was formed into a bilayer structure of the lower layer 13a and the upper layer 13b. The In concentration of the lower layer 13a (e.g., 40 to 60 w.t %) was higher than that of a conventional GIZO layer, and the upper layer 13b had an In concentration lower than that of the lower layer 13a (a bilayer). Referring to FIG. 3C, the two cases show the almost same s-factor.

However, a GIZO layer with a higher In concentration as described above may have undesirably lowered stability. The GIZO layer with low stability may be easily damaged by plasma during a process of forming a passivation layer 15. If the GIZO layer is damaged by plasma, the concentration of carriers may be detrimentally increased due to oxygen deficiency caused by the lattice damage of a surface of the GIZO layer. Furthermore, an undesirable off current may be increased due to the decrease of specific resistivity caused by the increase of the concentration of carriers. Therefore, electrical characteristics of the TFT may be detrimentally lowered, or the switching function of the TFT may not be performed at all.

Thus, in an embodiment, a surface portion of the oxide semiconductor layer 13 exposed in the process of forming the passivation layer 15 may include the upper layer 13b with an In concentration lower than that of the lower layer 13a. In other words, the upper layer 13b may have an In concentration similar to a conventional GIZO layer. This may minimize the damage to the oxide semiconductor layer 13. In order to increase the protective effect obtained in an embodiment, the thickness of the upper layer 13b is preferably thicker than that of the lower layer 13a.

The lower layer 13a positioned at the interface between the oxide semiconductor layer 13 and the gate insulating layer 12 may have high mobility of carriers (electrons). The upper layer 13b exposed in the process of forming the passivation layer 15 may have a solid structure. Accordingly, in the oxide semiconductor layer 13, electrical characteristics may be beneficially maintained at a certain level and not undesirably deteriorated due to the damage caused by plasma.

Figure 4A:
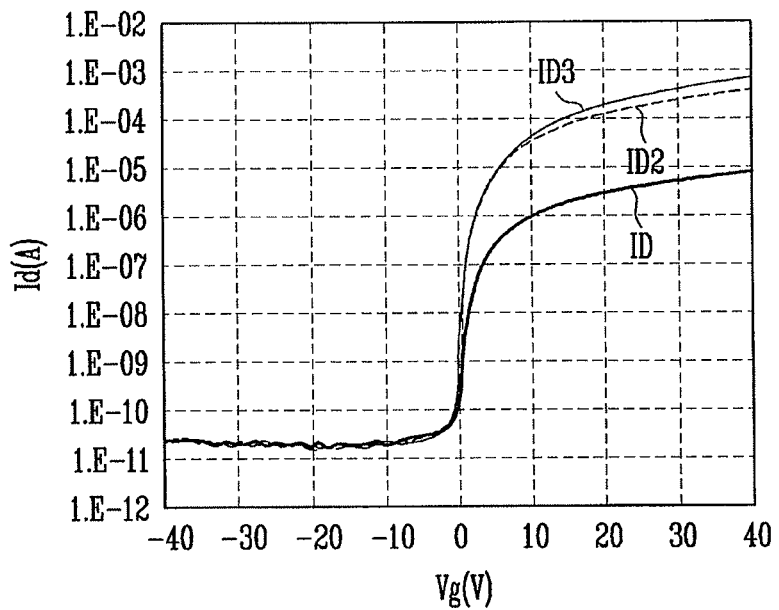
FIGS. 4A and 5A illustrate graphs of experimental results of electrical characteristics of an active layer before forming a passivation layer.
Figure 4B:
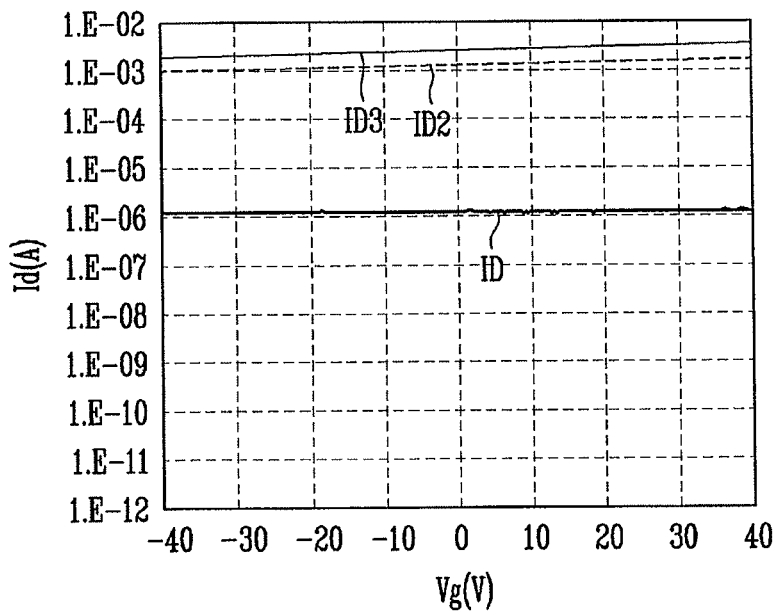
FIGS. 4B and 5B illustrate graphs of experimental results of electrical characteristics of an active layer after forming a passivation layer.

FIGS. 4A and 4B illustrate graphs showing electrical characteristics measured before and after forming a passivation layer, in a case where an active layer is formed with only a GIZO layer with an In concentration higher than the conventional GIZO layer. Referring to FIGS. 4A and 4B, semiconductor characteristics are shown before forming the passivation layer, and after forming the passivation layer. The change in electrical characteristics of the active layer may result from damage caused by plasma generated in the process of forming the passivation layer.

Figure 5A:
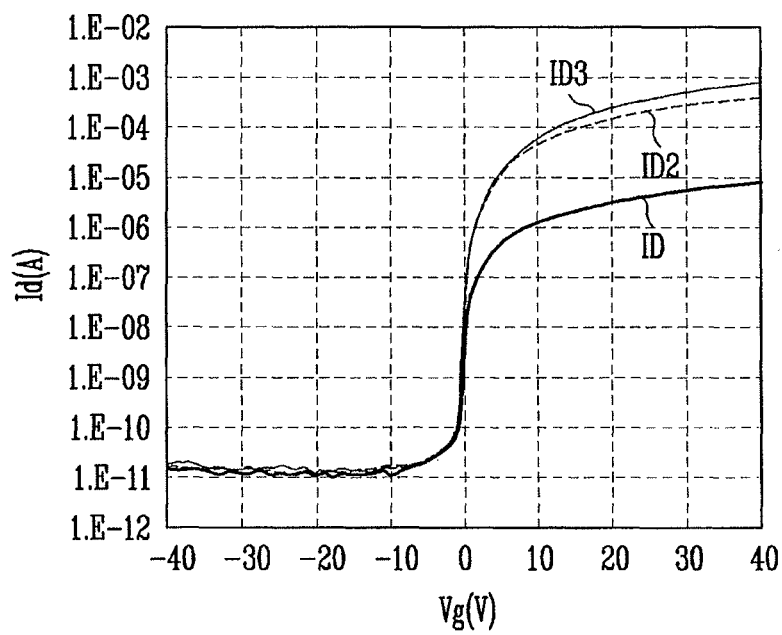
Figure 5B:
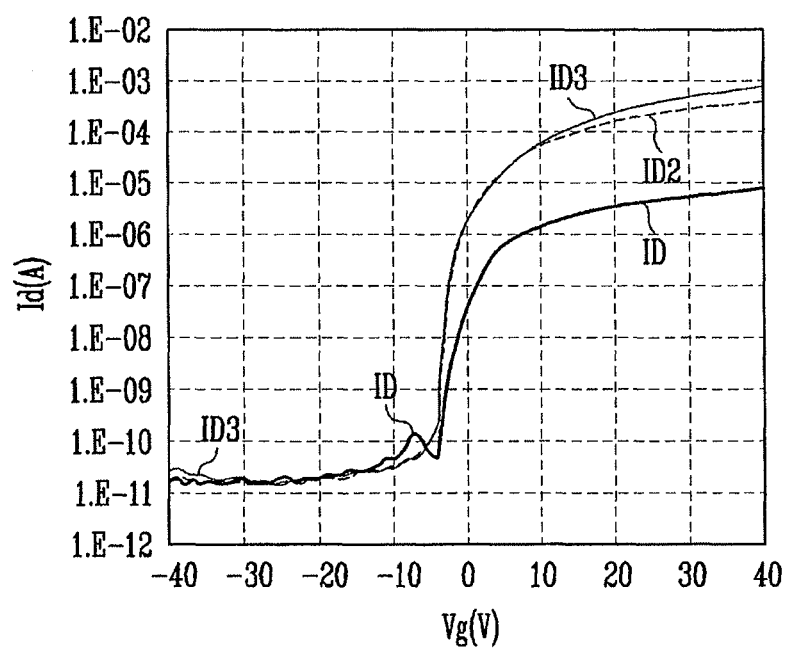

FIGS. 5A and 5B illustrate graphs showing electrical characteristics measured before and after forming a passivation layer in a case where an active layer has a bilayer structure of the lower layer 13a and the upper layer 13b of an embodiment. Semiconductor characteristics at similar levels are shown before and after forming the passivation layer.

Figure 6:
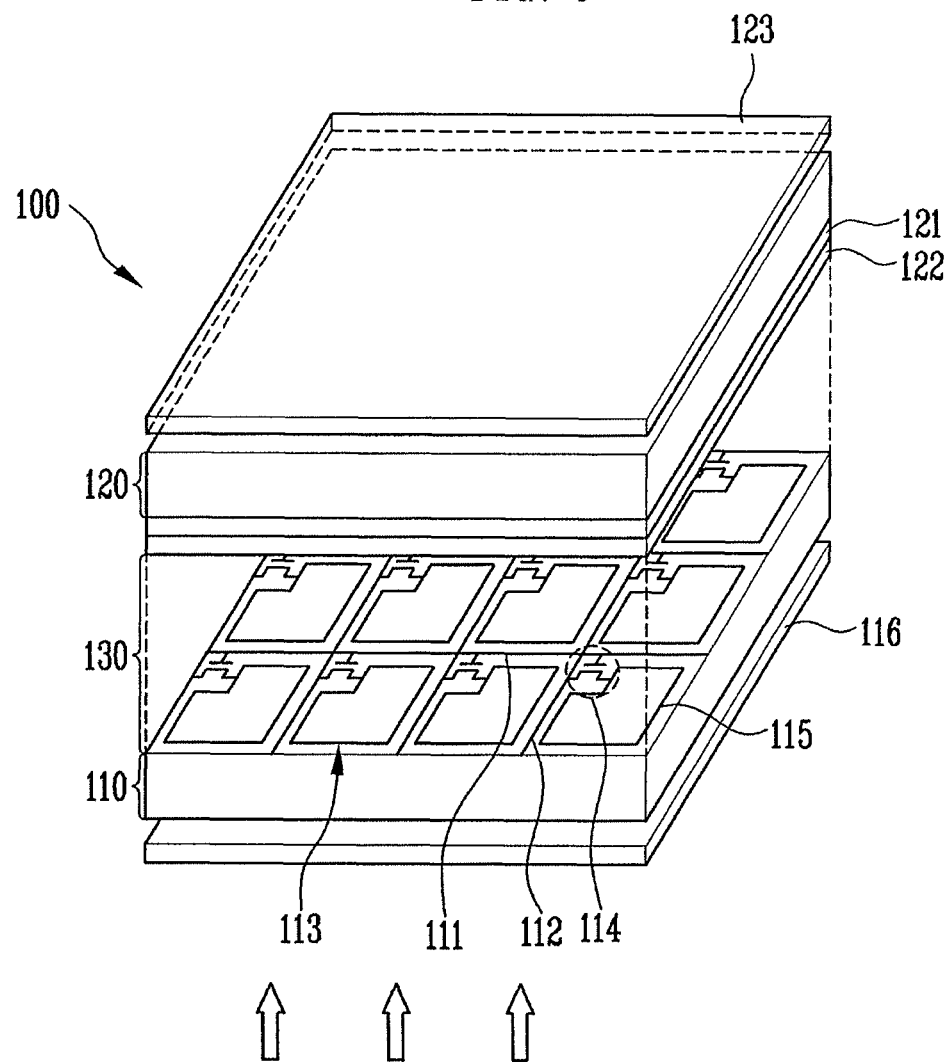
FIG. 6 illustrates a perspective view of a display device including the TFT according to an embodiment.

FIG. 6 illustrates a perspective view illustrating an embodiment of a display device including the TFT according to an embodiment. The display device may include, e.g., a flat panel display device, and LCD device, an OLED device, etc. A display panel 100 will be schematically described below.

The display panel 100 may include lower and upper substrates 110 and 120 disposed opposite to each other, and a liquid crystal layer 130 interposed between the lower and upper substrates 110 and 120. A pixel region 113 may be defined by a plurality of gate and data lines 111 and 112 arranged in a matrix form on the lower substrate 110. A TFT 114 controlling a signal supplied to each pixel and a pixel electrode 115 connected to the TFT 114 may be formed at an intersection portion of the gate and data lines 111 and 112 on the lower substrate 110.

The TFT 114 may have the same structure as described in FIG. 1. The TFT 114 may be fabricated using the fabrication method of an embodiment, described with reference to FIGS. 2A to 2C.

A color filter 121 and a common electrode 122 may be formed on the upper substrate 120. Polarizing plates 123 and 116 may be formed on surfaces of the upper and lower substrates 120 and 110, respectively. A backlight (not shown) as a light source may be disposed below the polarizing plate 116.

Meanwhile, although not shown in the drawings, a driver (LCD drive IC) driving the display panel 100 may be mounted in the vicinity of the pixel region 113 of the display panel 100. The driver may convert electrical signals supplied from the outside into scan and data signals to supply the converted scan and data signals to gate and data lines, respectively.

Figure 7A:
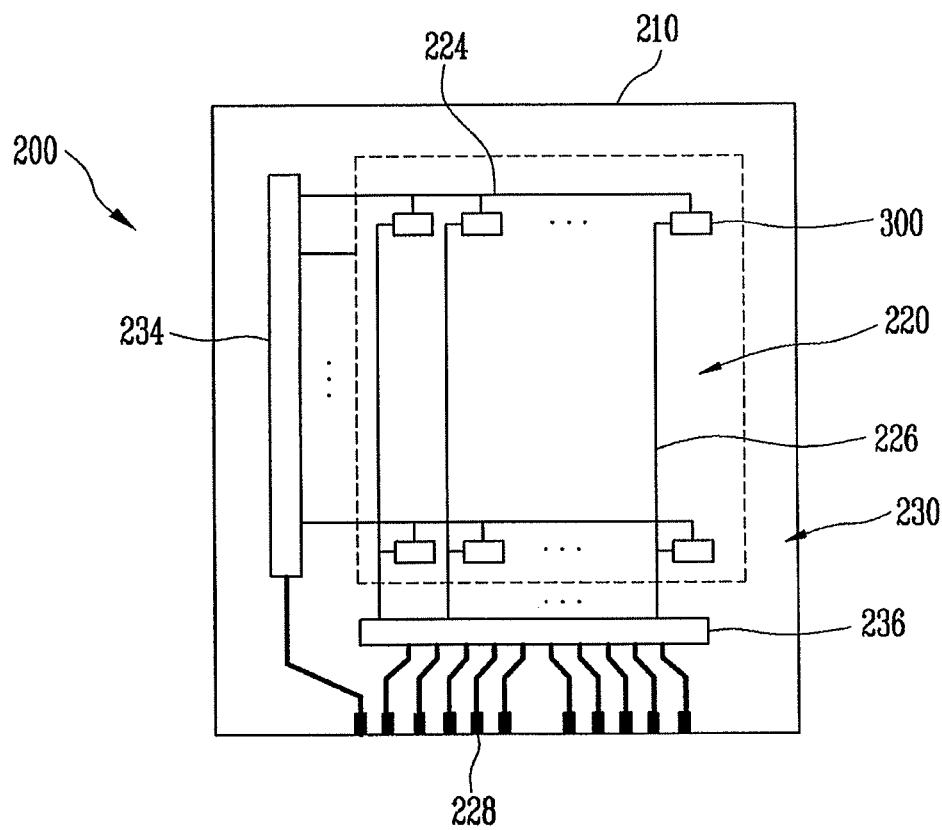
FIGS. 7A and 7B each illustrate a plan view and a cross-sectional view of a display device including the TFT according to an embodiment.
Figure 7B:
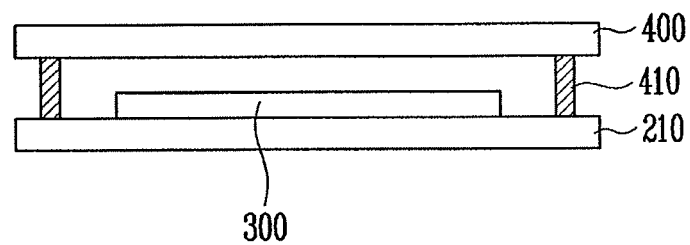

FIGS. 7A and 7B illustrate a plan view and a cross-sectional view, respectively, of another embodiment of a display device including the TFT according to an embodiment. The display device may include a flat panel display device. A display panel 200 displaying images will be schematically described below.

Referring to FIG. 7A, a substrate 210 may be divided into a pixel region 220 and a non-pixel region 230 surrounding the pixel region 220. A plurality of organic light emitting devices 300, coupled in a matrix form between scan and data lines 224 and 226, may be formed in the pixel region 220 of the substrate 210. In the non-pixel region 230 of the substrate 210, a power supply line (not shown) operating the organic light emitting devices 300 may extend from the scan and data lines 224 and 226 of the pixel region 220. Scan and data drivers 234 and 236, coupled to scan and data lines 224 and 226, may process signals supplied from the outside through pads 228.

Figure 8:
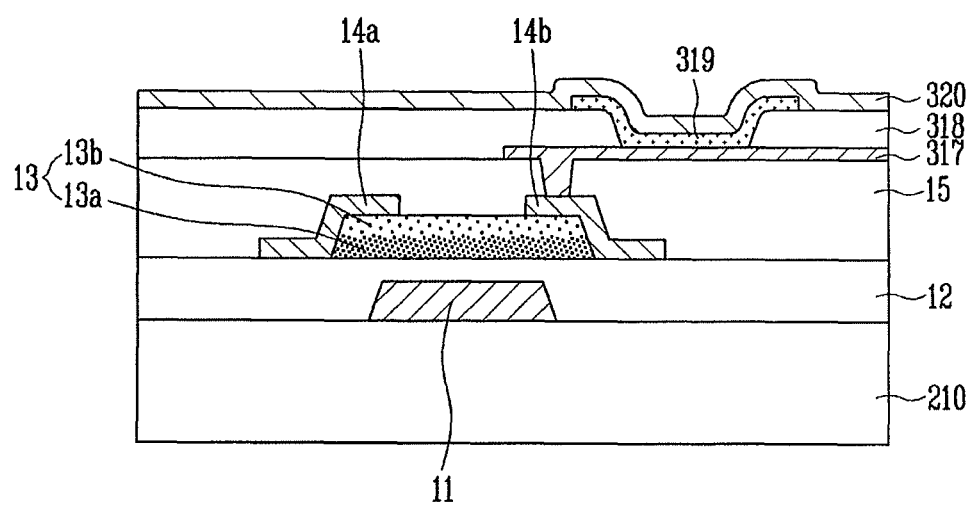
FIG. 8 illustrates a cross-sectional view of an organic light emitting device of FIG. 7A.

FIG. 8 illustrates a cross-sectional view of an organic light emitting device of FIG. 7A.

Referring to FIG. 8, the organic light emitting device 300 (see FIG. 7A) may include an anode electrode 317, a cathode electrode 320, and an organic thin film layer 319 between the anode electrode 317 and the cathode electrode 320. The organic thin film layer 319 may have a structure in which a hole transport layer, an organic light emitting layer, and an electron transport layer may be laminated. The organic thin film layer 319 may further include, e.g., a hole injection layer and an electron injection layer. The organic light emitting device 300 may further include a TFT controlling the operations of the organic light emitting device 300, and a capacitor maintaining signals.

The TFT may have the same structure as described in FIG. 1. The TFT may be fabricated using the fabrication method of an embodiment described with reference to FIGS. 2A to 2C.

The organic light emitting device 300 having a TFT of an embodiment will be described below with reference to FIGS. 7A to 8. A gate electrode 11 may be formed on the substrate 210. A scan line 224 coupled to the gate electrode 11 may be formed in the pixel region 220. A scan line 224 may extend from the pixel region 220 into the non-pixel region 230. A pad 228 for, e.g., receiving a signal supplied from the outside, may also be formed in the non-pixel region 230.

A gate insulating layer 12 may be formed on the substrate 210 including the gate electrode 11. An oxide semiconductor layer 13 may be formed on the gate insulating layer 12. The oxide semiconductor layer 13 may be electrically isolated from the gate electrode 11, and may have a channel region, a source region, and a drain region. The oxide semiconductor layer 13 may include a GIZO bilayer structure, with each of the layers having different In concentrations. In the GIZO bilayer structure, the In concentration of a lower layer 13$a$ may be higher than that of an upper layer 13$b$.

Source and drain electrodes 14$a$ and 14$b$ in contact with the source and drain regions, respectively, may be formed on the oxide semiconductor layer 13. A data line 226 coupled to the source and drain electrodes 14$a$ and 14$b$ may be formed in the pixel region 220. The data line 224 may extend from the pixel region 220 into the non-pixel region 230.

A passivation layer 15 may be formed on the substrate 210 including the source and drain electrodes 14$a$ and 14$b$. A via hole may be formed in the passivation layer 15 to expose the source and/or drain electrode 14$a$ or 14$b$. The passivation layer 15 may have a multi-layered structure for the purpose of, e.g., insulation and planarization.

An anode electrode 317 coupled to the source or drain electrode 14$a$ or 14$b$ through the via hole may be formed at one region on the passivation layer 15. A pixel defining layer 318 may be formed on the passivation layer 15 so that a region (a light emitting region) of the anode electrode 317 may be exposed. An organic thin film layer 319 may be formed on the exposed anode electrode 317. A cathode electrode 320 may be formed on the pixel defining layer 318 having the organic thin film layer 319.

Referring to FIG. 7B, a sealing substrate 400, sealing the pixel region 220, may be disposed above the substrate 210 including the organic light emitting device 300. The sealing substrate 400 sealed by a sealing material 410 may be joined with the substrate 210, so that the display panel is completed.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope as set forth in the following claims.

What is claimed is:

1. A method of manufacturing a display device, comprising:

forming a thin film transistor, including:
  forming a gate electrode on a substrate;
  forming a gate insulating layer on the substrate having the gate electrode;
  forming on the gate insulating layer an oxide semiconductor layer with a channel region, a source region and a drain region;
  forming source and drain electrodes in contact with the source and drain regions of the oxide semiconductor layer, respectively,
  wherein the forming of the oxide semiconductor layer includes:
    depositing ions including In, Ga, and Zn from a target to form a lower layer on the gate insulating layer, and forming an upper layer on the lower layer, the upper layer having an In concentration lower than the lower layer, and providing a display panel with the thin film transistor.

2. The method as claimed in claim 1, wherein the In concentration of the lower layer is about 40 to about 60 at. %, and the In concentration of the upper layer is about 30 to about 50 at. %.

3. The method as claimed in claim 1, wherein the target includes an InGaZnO target and an InZnO target.

4. The method as claimed in claim 3, wherein, during forming the lower layer and upper layer, the In concentration in the upper layer is altered by adjusting the amplitude of the bias power applied to the respective InGaZnO and InZnO targets.

5. The method as claimed in claim 3, wherein, during forming the lower layer and upper layer, the In concentration in the upper layer is altered by adjusting the intensity of a pulse laser irradiating the respective InGaZnO and InZnO targets.

6. The method as claimed in claim 3, wherein, during forming the lower layer and upper layer, the In concentration is altered by adjusting the molar ratio of In in the InGaZnO and InZnO targets.

* * * * *